(12) United States Patent
Meyer et al.

(10) Patent No.: US 12,408,496 B2
(45) Date of Patent: Sep. 2, 2025

(54) PATTERNED DEPOSITION MASK FORMED USING POLYMER DISPERSED IN A LIQUID SOLVENT

(71) Applicant: LUMILEDS LLC, San Jose, CA (US)

(72) Inventors: Jens Meyer, Cologne (DE); Marinus Johannes Petrus Maria van Gerwen, Aachen (DE); Ronja Missong, Aachen (DE)

(73) Assignee: Lumileds Singapore Pte. Ltd., Singapore (SG)

( * ) Notice: Subject to any disclaimer, the term of this patent is extended or adjusted under 35 U.S.C. 154(b) by 273 days.

(21) Appl. No.: 17/973,007

(22) Filed: Oct. 25, 2022

(65) Prior Publication Data
US 2023/0138348 A1 May 4, 2023

Related U.S. Application Data

(60) Provisional application No. 63/273,578, filed on Oct. 29, 2021.

(51) Int. Cl.
*H10H 20/851* (2025.01)
*H01L 21/02* (2006.01)
*H01L 21/027* (2006.01)

(52) U.S. Cl.
CPC ... *H10H 20/8513* (2025.01); *H01L 21/02282* (2013.01); *H01L 21/0274* (2013.01)

(58) Field of Classification Search
None
See application file for complete search history.

(56) References Cited

U.S. PATENT DOCUMENTS

| 2012/0074835 | A1 | 3/2012 | Piquette et al. |
| 2015/0034983 | A1 | 2/2015 | Takenaka et al. |
| 2015/0166888 | A1* | 6/2015 | Katsumoto ............. H01L 33/56 |
| | | | 252/301.4 R |
| 2019/0194531 | A1* | 6/2019 | Oba ........................ C09K 11/02 |

(Continued)

FOREIGN PATENT DOCUMENTS

| EP | 3273491 A1 * | 1/2018 | ............. H01L 24/97 |
| EP | 3321718 A1 | 5/2018 | |

(Continued)

OTHER PUBLICATIONS

From the EPO as the ISA, "Notification of Transmittal of the International Search Report and the Written Opinion of the International Searching Authority, or the Declaration", PCT/US2022/047842, Feb. 22, 2023, 12 pages.

*Primary Examiner* — Michael P. Rodriguez

(57) ABSTRACT

A polymer dispersion layer is formed on a substrate or semiconductor light-emitting devices on the substrate. After forming the polymer dispersion layer, drying and curing the polymer dispersion layer forms a cured polymer layer. After curing and drying, with the cured polymer layer being present on only selected, masked areas of the substrate or light-emitting devices, and with other areas of the substrate or light-emitting devices lacking the cured polymer layer and remaining exposed, a material layer is formed on at least the exposed areas of the substrate or light-emitting devices. After forming the material layer, the cured polymer layer is removed from the masked areas, leaving the material layer on the exposed areas.

20 Claims, 8 Drawing Sheets

(56) References Cited

U.S. PATENT DOCUMENTS

| | | |
|---|---|---|
| 2019/0195466 A1 | 6/2019 | Shimizu et al. |
| 2020/0032137 A1* | 1/2020 | Watano .................... G02B 5/20 |
| 2020/0212101 A1 | 7/2020 | Masui et al. |
| 2021/0111320 A1 | 4/2021 | Lopez-Julia et al. |

FOREIGN PATENT DOCUMENTS

| | | |
|---|---|---|
| WO | 2009/090580 A1 | 7/2009 |
| WO | 2021/081300 A1 | 4/2021 |

* cited by examiner

PATTERNED DEPOSITION MASK FORMED USING POLYMER DISPERSED IN A LIQUID SOLVENT

BENEFIT CLAIM

This application claims benefit of U.S. provisional App. No. 63/273,578 entitled "Patterned deposition mask formed using polymer dispersed in a liquid solvent" filed Oct. 29, 2021 in the names of Jens Meyer, Marinus Johannes Petrus Maria van Gerwen, and Ronja Missong; said application is incorporated herein by reference in its entirety.

FIELD OF THE INVENTION

The invention relates generally to processes for fabricating light-emitting diodes or phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs can be formed together on a single substrate to form an array. Such arrays can be employed to form active illuminated displays, such as those employed in smartphones and smart watches, computer or video displays, or signage. An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-mini- or pc-microLED arrays. In the following description,

SUMMARY

An inventive method comprises forming, on a substrate or on one or more semiconductor light-emitting devices mounted on or formed on the substrate, a polymer dispersion layer that comprises polymer particles dispersed in a liquid solvent. The inventive method can further include, after forming the polymer dispersion layer, drying and curing the polymer dispersion layer to form a cured polymer layer. The inventive method can further include, after curing and drying, with the cured polymer layer being present on only one or more selected, masked areas of the substrate or light-emitting devices, and with one or more other areas of the substrate or light-emitting devices lacking the cured polymer layer and remaining exposed, forming a material layer on at least the one or more exposed areas. The inventive method can further include, after forming the material layer, removing the cured polymer layer from the one or more masked areas, leaving the material layer on the one or more exposed areas.

In some examples, the polymer dispersion layer is formed on only the masked areas before being dried and cured; in some other examples, the polymer dispersion layer can be formed on both masked and exposed areas before being dried and cured, and then portions of the cured layer can be removed to form exposed areas of the substrate or light-emitting devices while leaving other portions of the cured polymer layer on the masked areas. In some examples, the material layer is formed on only the exposed areas; in some other examples, the material layer is formed on both the masked and exposed areas, and removal of the cured polymer layer from the masked areas also removes corresponding portions of the material layer from the masked areas while leaving other corresponding portions of the material layer on the exposed areas.

Objects and advantages pertaining to LEDs, pcLEDs, miniLED arrays, pc-miniLED arrays, microLED arrays, and pc-microLED arrays may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
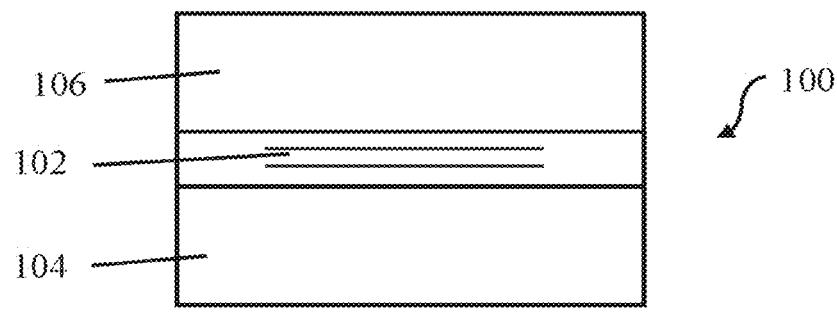
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a wavelength converting structure (e.g., phosphor layer) 106 disposed on the LED. Semiconductor diode structure 102 typically comprises an active region disposed between n-type and p-type layers. In some examples the combined thickness of those layers can be less than about 5.0 microns thick. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

Figure 2A:
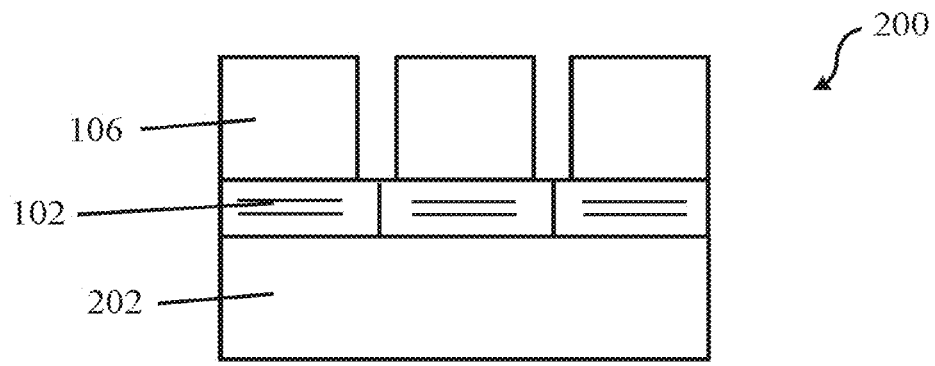
FIGS. 2A and 2B show, respectively, cross-sectional and top schematic views of an example array of pcLEDs.
Figure 2B:
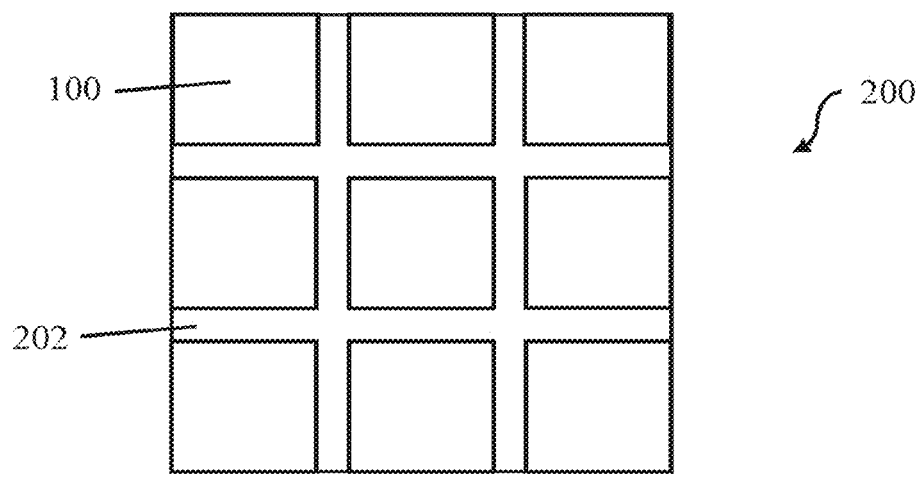

FIGS. 2A-2B show, respectively, cross-sectional and top views of an array 200 of pcLEDs 100, each including a phosphor pixel 106, disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
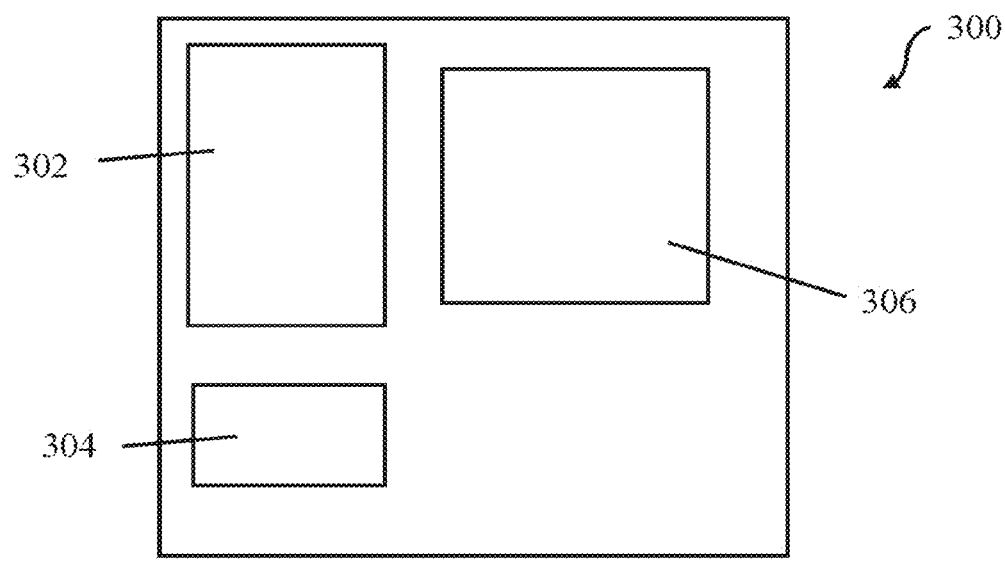
FIG. 3A shows a schematic top view an example electronics board on which an array of pcLEDs may be mounted, and FIG. 3B similarly shows an example array of pcLEDs mounted on the electronic board of FIG. 3A.
Figure 3B:
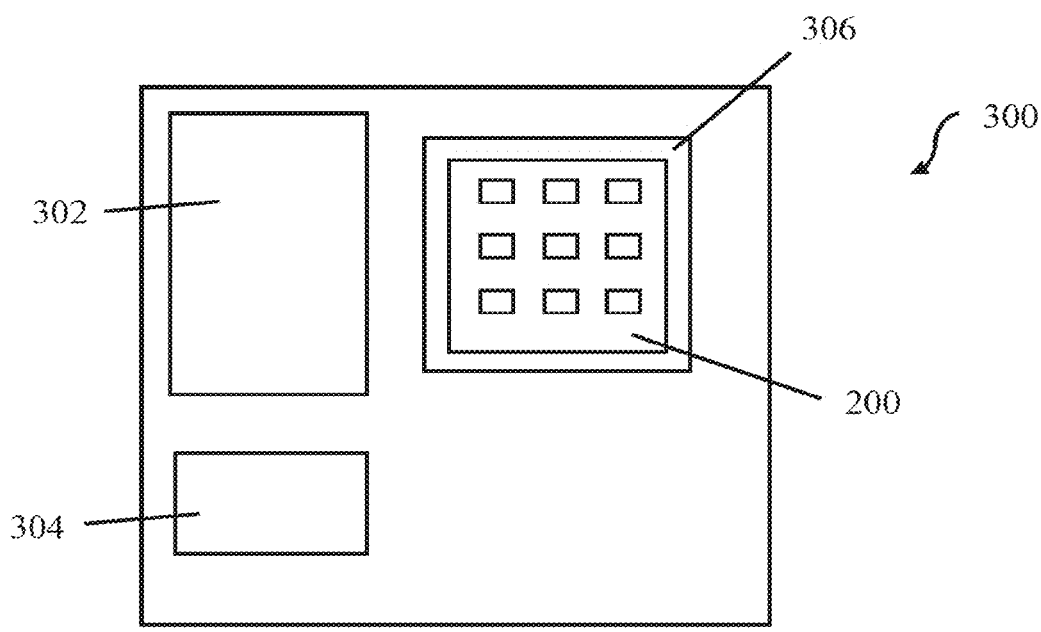

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
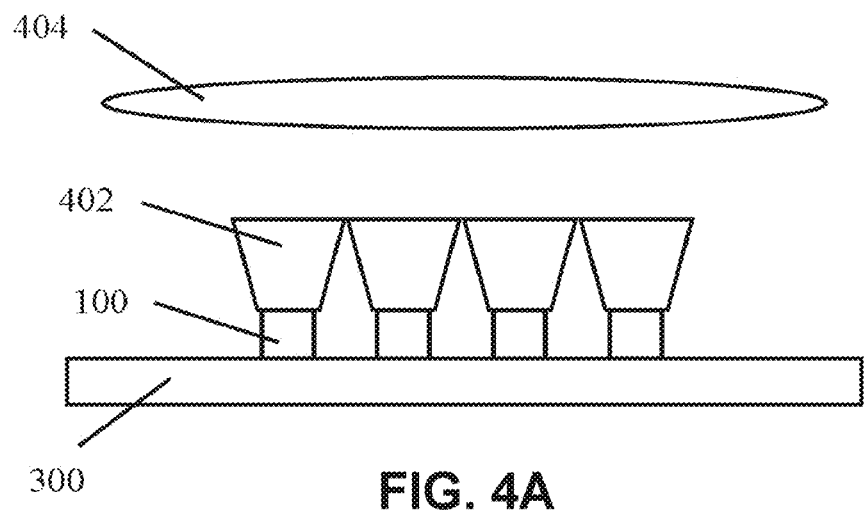
FIG. 4A shows a schematic cross-sectional view of an example array of pcLEDs arranged with respect to waveguides and a projection lens.
Figure 4B:
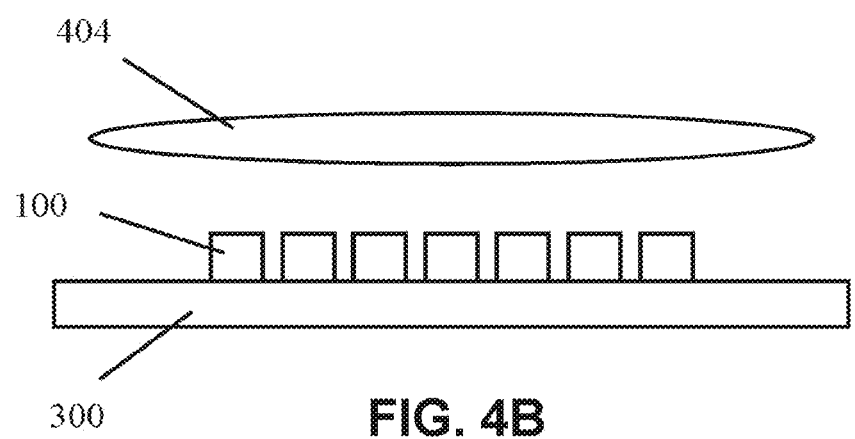
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 4A-4B, for example. Generally, any suitable arrangement of optical elements may be used in combination with the pcLEDs described herein, depending on the desired application.

FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

Figure 2C:
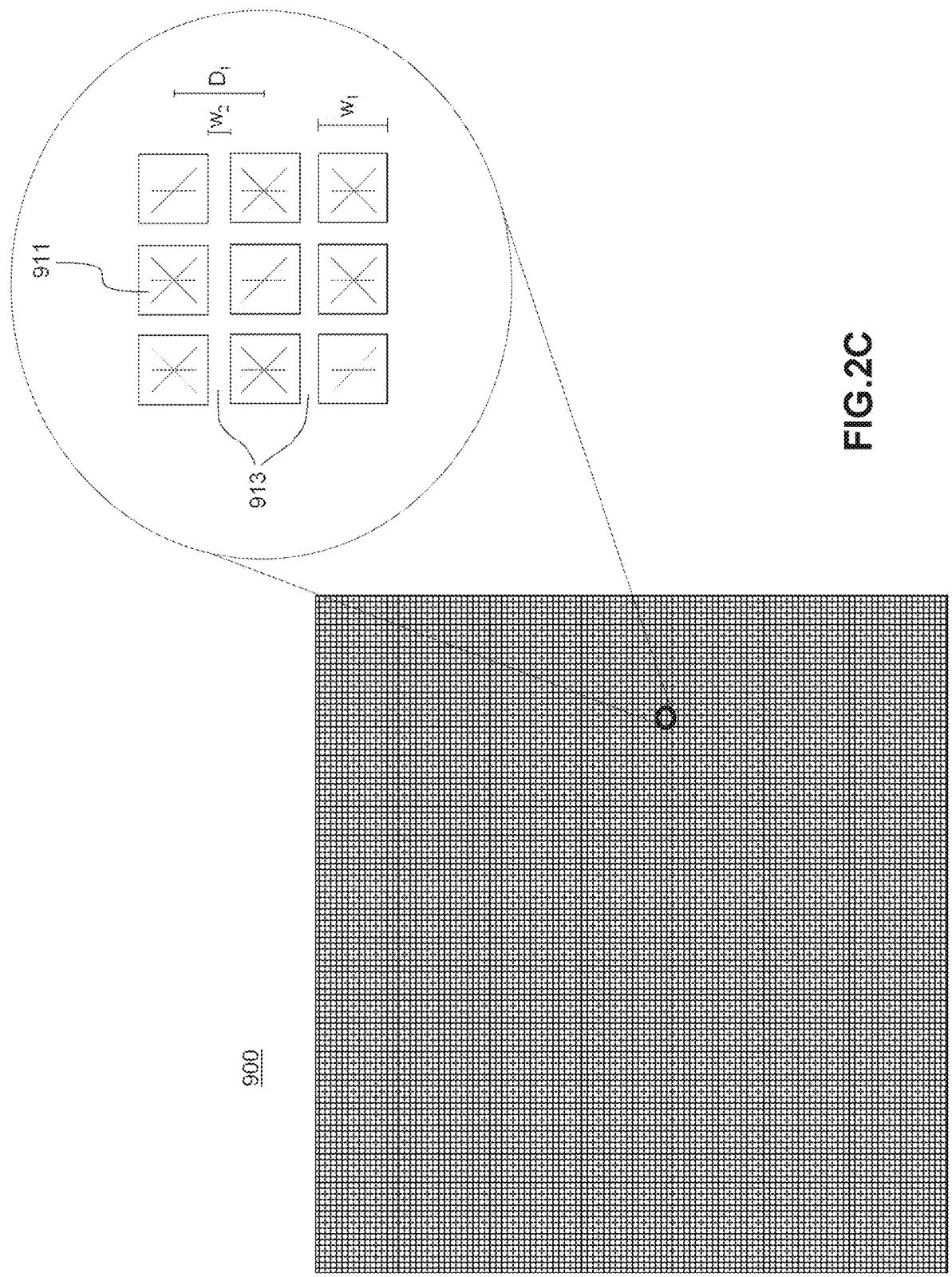
FIG. 2C shows a top schematic view of an example miniLED or microLED array and an enlarged section of 3×3 LEDs of the array.

Although FIGS. 2A and 2B show a 3×3 array of nine pcLEDs, such arrays may include for example on the order of $10^2$, $10^3$, $10^4$, or more LEDs, e.g., as illustrated schematically in FIG. 2C. Individual LEDs 911 (i.e., pixels) may have widths $w_1$ (e.g., side lengths) in the plane of the array 900, for example, less than or equal to 1.0 millimeter (mm), less than or equal to 0.5 mm, less than or equal to 0.10 mm, or less than or equal to 0.05 mm. LEDs 911 in the array 900 may be spaced apart from each other by streets, lanes, or trenches 913 having a width $w_2$ in the plane of the array 900 of, for example, a few tenths of a millimeter, less than or equal to 0.10 mm, less than or equal to 0.05 mm, less than or equal to 0.020 mm, less than or equal to 0.010 mm, or less than or equal to 0.005 mm. The pixel pitch $D_1$ is the sum of $w_1$ and $w_2$. Although the illustrated examples show rectangular pixels arranged in a symmetric matrix, the pixels and the array may have any suitable shape or arrangement. Multiple separate arrays of LEDs can be combined in any suitable arrangement in any applicable format.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 2D:
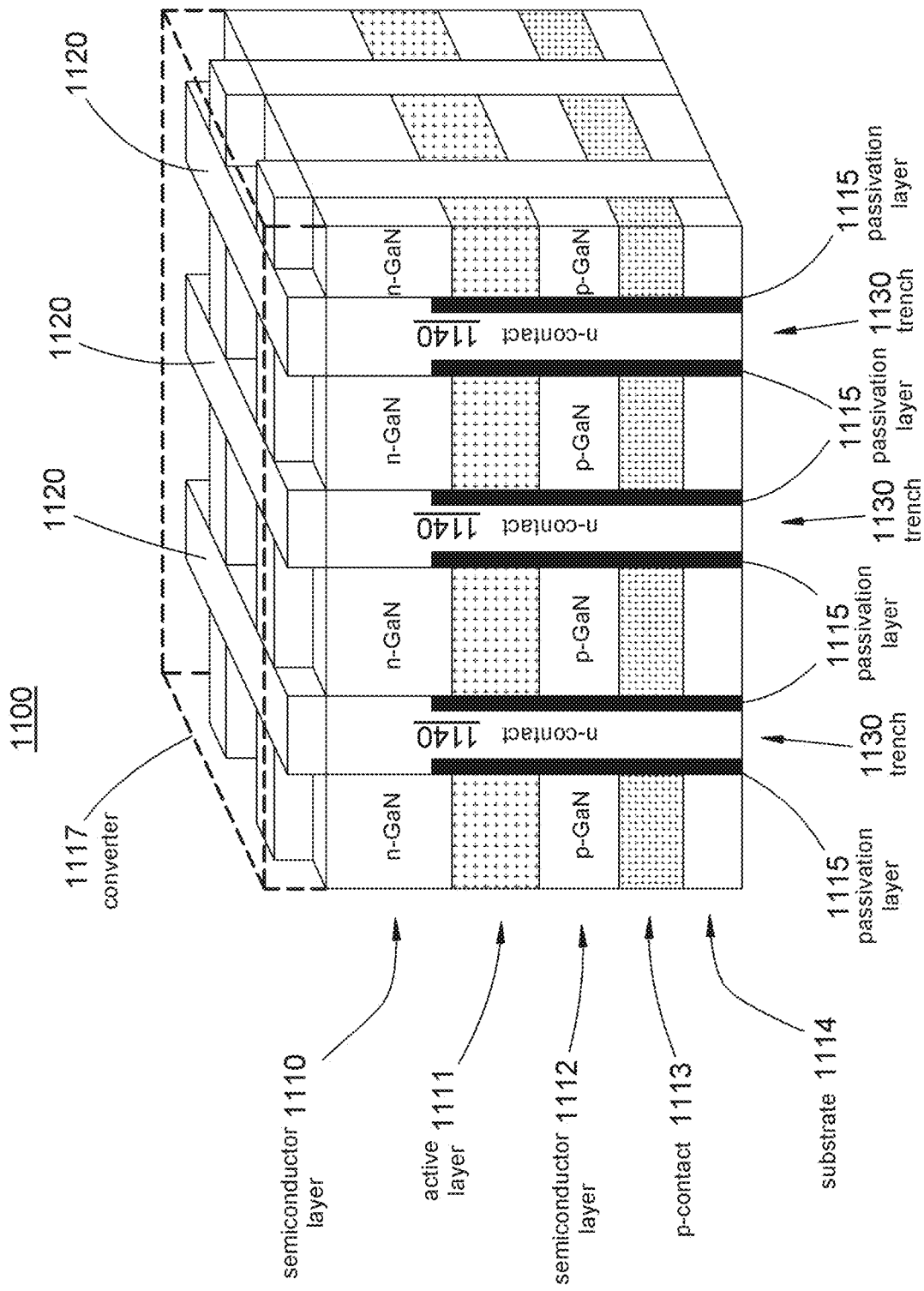
FIG. 2D shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 2D shows a perspective view of an example of such a segmented monolithic array 1100. Pixels in this array are separated by trenches 1130 which are filled to form n-contacts 1140. The monolithic structure is grown or disposed on a substrate 1114. Each pixel includes a p-contact 1113, a p-GaN semiconductor layer 1112, an active region 1111, and an n-GaN semiconductor layer 1110. A wavelength converter material 1117 may be deposited on the semiconductor layer 1110 (or other applicable intervening layer). Passivation layers 1115 may be formed within the trenches 1130 to separate at least a portion of the n-contacts 1140 from one or more layers of the semiconductor. The n-contacts 1140, or other material within the trenches, may extend into the converter material 1117 such that the n-contacts 1140 or other structures or materials provide complete or partial optical isolation barriers 1120 between the pixels.

The individual LEDs (pixels) in an LED array may be individually addressable, may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

For any number of different reasons, it may be desirable to form one or more layers on portions of one or more LEDs or on portions of a substrate on which one or more LEDs are formed or mounted. In many instances such layers are formed in a spatially selective manner, with certain areas of the LEDs and/or substrate being covered while other areas remain exposed. Situations in which such spatially selective layer formation might be desirable include, e.g., masked deposition, growth, or formation of layers or structures on the LEDs and/or the substrate. A mask layer can be formed in a spatially selective manner to cover certain areas where deposition or growth is not desired. After the growth or deposition process, the mask layer can be removed, leaving the newly formed layer or structure on only those areas that had been left exposed by the mask.

Figure 5A:
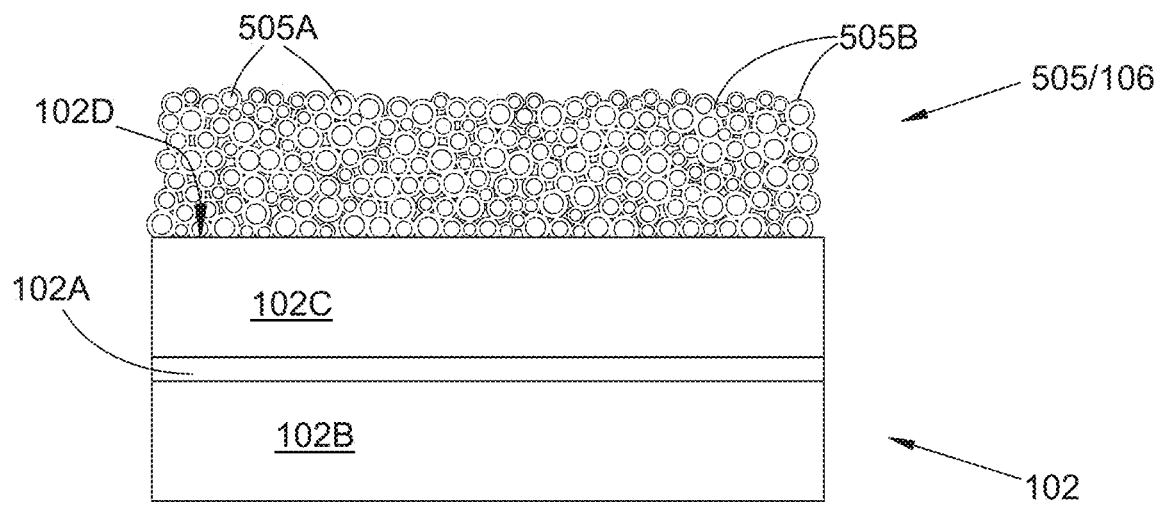
FIGS. 5A through 5C show schematic cross-sectional views of example LEDs comprising a semiconductor LED and a particle layer.
Figure 5B:
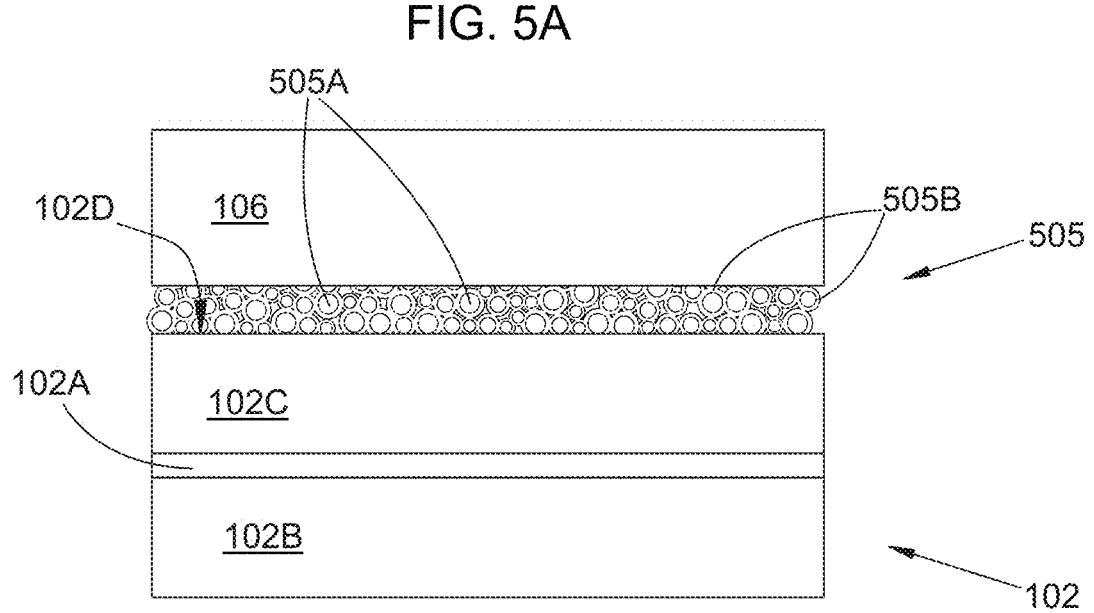
Figure 5C:
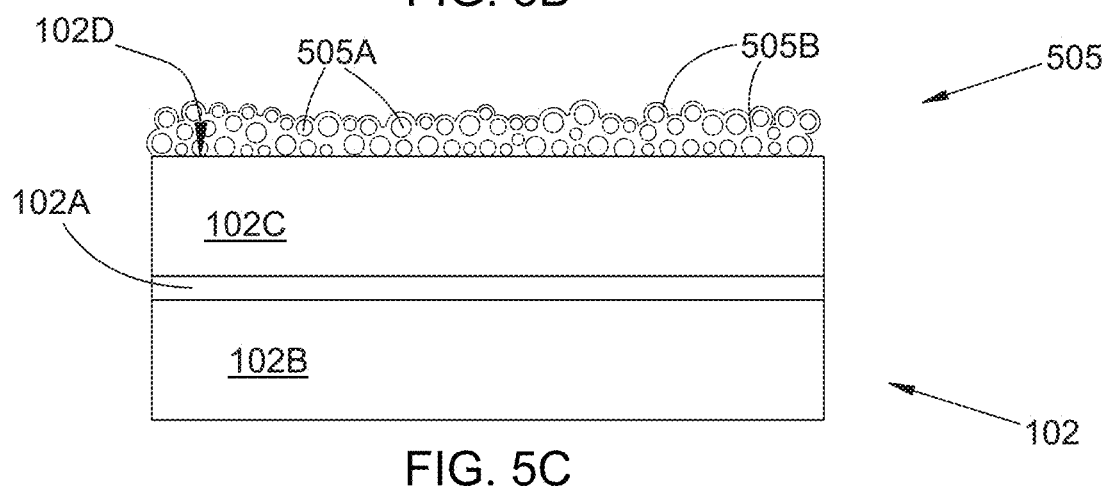

Such a masked deposition process might be used, e.g., to form or bond the phosphor converter layers 106 on light output surfaces of the LEDs 102 without also forming or bonding material onto other areas, such as on the back side of the substrate 202 or on integrated circuitry or electrical traces (not shown) on the substrate 202. In some examples, such as those disclosed in U.S. Pat. Pub. Nos. 2018/0122993, 2020/0388726, 2020/0411736, 2021/0113316, or 2021/0111320, or in pending U.S. non-provisional application Ser. No. 17/066,278 (each or which is incorporated by reference in its entirety) and shown in FIGS. 5A-5C, a thin layer of dielectric material 505B can be deposited onto a layer of micron-scale particles 505A to bond the particles to each other and to the LEDs 102 (made up of layers 102A/B/C with an output surface 102D; substrate 202 not shown). In some examples optically scattering or luminescent particles can be employed. The resulting particle layer 505 can bind each LED 102 to a phosphor converter 106 or other structure (e.g., as in FIG. 5B), or can serve as the phosphor converter (e.g., as in FIG. 5A). In some examples the particles bound to the LEDs with the dielectric layer can act as an optical coupling layer (e.g., as in FIG. 5C); in some instances such optical coupling can be enhanced by employing material for the layer 505B that is index-matched, or nearly index-matched, to the LED 102.

In any of those arrangements, any one or more suitable materials can be employed for the particles 505A (e.g., glass, ceramic, crystalline or polycrystalline, and so forth) or for the thin dielectric layer 505B (e.g., one or more metal or semiconductor oxides, such as $Al_2O_3$, $HfO_2$, $SiO_2$, $Ga_2O_3$, $GeO_2$, $SnO_2$, $CrO_2$, $TiO_2$, $Ta_2O_5$, $Nb_2O_5$, $V_2O_5$, $Y_2O_3$, or $ZrO_2$). The particles 505A can be sub-micron to micron scale, e.g., being characterized by a D50 (i.e., median transverse dimension) greater than about 0.10 µm and less than about 20 µm. The particles 505A can be applied to the light output surface 102D in any suitable way, such as by spray-coating, sedimentation, and so forth. The coating layer 505B is then deposited onto the particles 505A and portions of the light output surface 102D (i.e., those left exposed by any mask layer that is present). A conformal deposition process can be used to deposit the coating layer 505B, so that it coats all sides of the particles 505A while remaining sufficiently thin (e.g., less than about 0.30 µm); if allowed to progress, the deposited coating layer material 505B can fill voids between the particles 505A. Typically, atomic layer deposition (ALD) or other suitable chemical vapor deposition (CVD) process is employed for depositing the coating layer material 505B. A typical ALD reaction is split into (at least) two parts, one involving an oxide precursor (e.g., metal or semiconductor halides, amides, alkyl amides, or alkoxides, or other metal, semiconductor, or organometallic compounds) and the other involving an oxygen source (e.g., water, ozone, or other suitable oxygen source). Alternating those steps and purging the reactor after each step lead to formation of atomic layers (or monolayers) due to the self-limiting nature of the surface reaction. The ALD sequence can be tailored in any suitable way to yield particle layer 505 having desired composition, spatial properties, or optical properties. In some examples a protection layer (not shown) can be formed on the LED 102 before formation of the particle layer 505, to protect the LED output surface 102D from potential degradation by exposure to precursors or reagents employed in the formation of the coating layer 505B. In some examples the protection layer (if present) and the coating layer can be formed at temperatures less than about 150° C. (e.g., if some or all of the electronic components on the substrate 202 cannot tolerate excessive heating).

A variety of mask materials exist, as well as a variety of methods for spatially selectively forming or depositing such mask materials. Examples can include, e.g., photolithography, laser ablation, wet or dry etching, and so forth. Many existing methods can be complex, expensive or difficult to implement, incompatible with desired material deposition or growth processes, or incompatible with the light-emitting devices, the substrate on which those devices are formed or mounted, or other structures present such as electrical components or traces. Accordingly, it would be desirable to provide methods and apparatus that include spatially selective masking that is simpler, cheaper or easier to implement, compatible with desired material deposition or growth processes, or compatible with the light-emitting devices, the substrate, or other structures.

In FIGS. 6A-6C and 7A-7C, the device 600 generically represents one or more light-emitting devices (e.g., LEDs or laser diodes) formed on or mounted on a substrate. The device 600 can be arranged in any suitable way, including, e.g., any of the arrangements of FIG. 2A-2D, 3A, 3B, 4A, 4B, or 5A-5C. A layer formed "on at least portions of the device 600" is formed on at least portions of the light-emitting devices, on at least portions of the substrate (in some instances including some or all of its back surface, opposite the light-emitting devices), or both. An inventive method includes forming on at least portions of the device 600 a polymer dispersion layer that comprises polymer particles dispersed in a liquid solvent. After forming the polymer dispersion layer, the polymer dispersion layer is dried (e.g., by solvent evaporation) and cured (e.g., by further polymerization or cross-linking) to form a cured polymer layer 620. The cured polymer layer 620 is present on only one or more selected, masked areas 600M of the device 600, with one or more other areas 600E of the device 600 lacking the cured polymer layer 620 and remaining exposed (e.g., as in FIGS. 6A and 7A). In some examples the polymer dispersion layer is formed on only the masked areas 600M (e.g., by spatially selective dispensing, ink-jet printing, screen printing, slot-die coating, or doctor-blade coating) before being dried and cured to form the cured polymer layer 620 on only those masked areas 600M. In some other examples the polymer dispersion layer can be formed initially on the entire device 600 (e.g., by dispensing, spin coating, slot-die coating, or doctor-blade coating) before being dried and cured; after drying and curing, portions of the cured polymer layer can be removed to form the exposed areas 600E while leaving the masked areas 600M covered by the cured polymer layer 620.

Figure 6A:
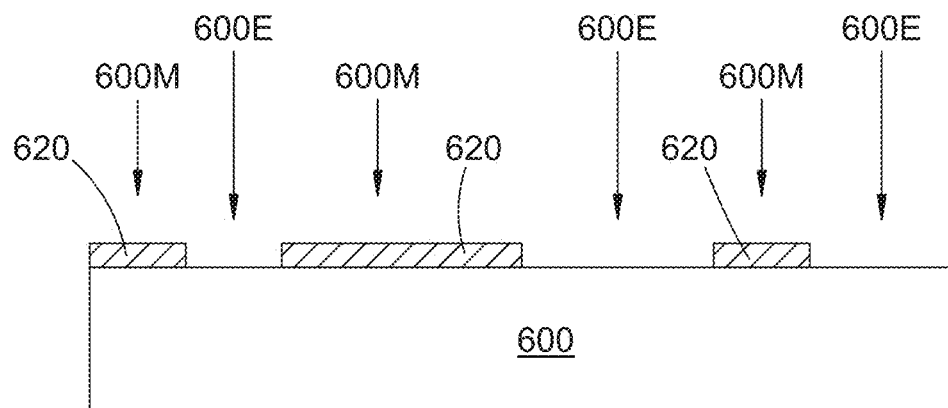
FIGS. 6A through 6C illustrate schematically an example inventive process.
Figure 6B:
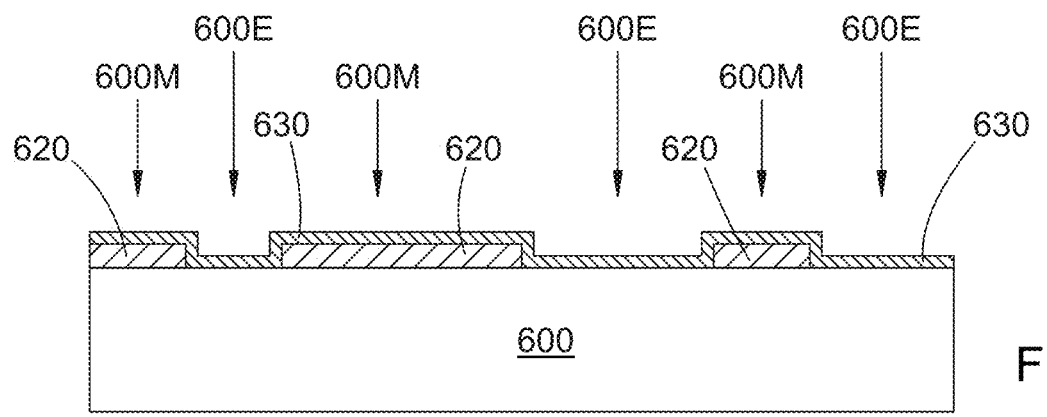
Figure 6C:
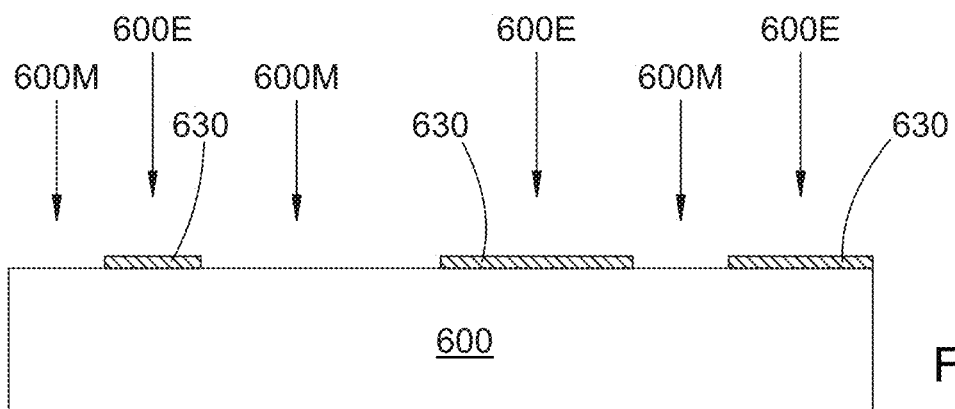
Figure 7A:
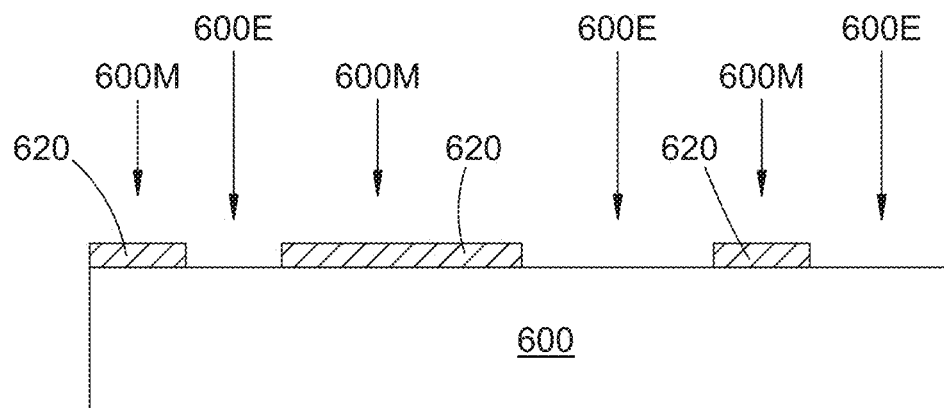
FIGS. 7A through 7C illustrate schematically an example inventive process.
Figure 7B:
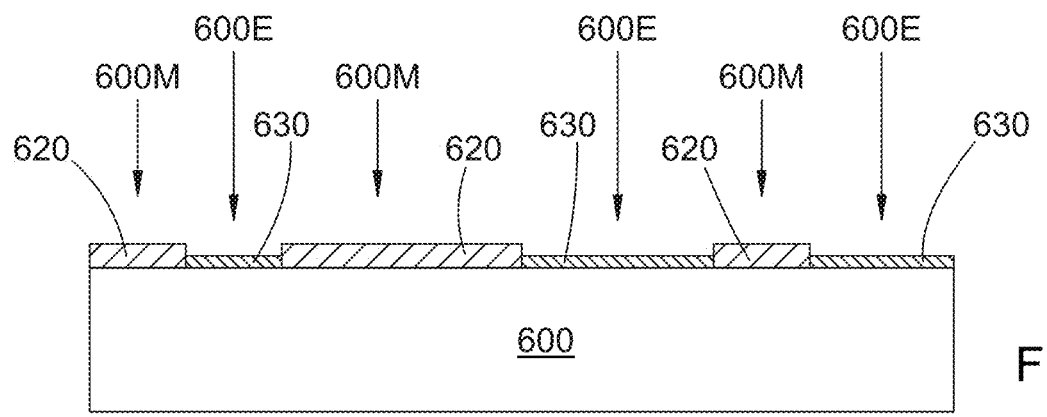
Figure 7C:
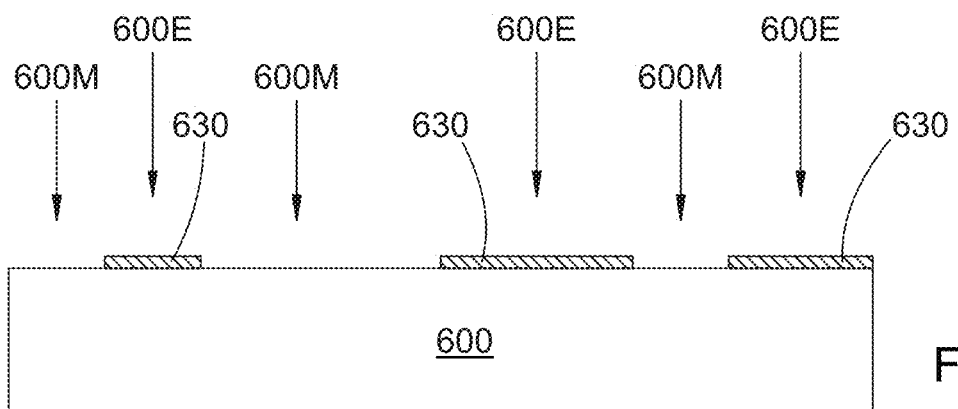

With the cured polymer layer 620 present on only the masked areas 600M and the areas 600E remaining exposed, a material layer 630 can be formed on at least the exposed areas 600E (e.g., as in FIGS. 6B and 7B). Some examples of material layers 630 that can be formed, and processes for such layer formation (e.g., deposition or growth), are described above; any suitable material layer 630 can be formed using any suitable process for formation. In some examples the material layer 630 can be a single layer less than about 0.30 µm thick or less than about 0.10 µm thick (e.g., formed by ALD or CVD as described above); in some examples the material layer 630 can be a layer of particles one or several microns thick or more bound by a thin dielectric layer (e.g., as in FIGS. 5A-5C). After forming the material layer 630, the cured polymer layer 620 can be removed from the one or more masked areas 600M, leaving the material layer 630 on only the one or more exposed areas 600E (e.g., as in FIGS. 6C and 7C). In some examples (e.g., as in FIG. 6B), the material layer 630 forms initially on the exposed areas 600E and also on the cured polymer layer 620 covering the masked areas 600M. Removal of the cured polymer layer 620 from the masked areas 600M also removes those portions of the material layer 630 formed on the cured polymer layer 620, leaving other portions of the material layer 630 on only the exposed areas 600E (as in FIG. 6C). In some other examples (e.g., as in FIG. 7B), the material layer 630 forms on only the exposed areas 600E and not on the cured polymer layer covering the masked areas 600M. Such a scenario might occur, e.g., if the cured polymer layer 620 is relatively inert or unreactive with respect to the growth, deposition, or other process used to form the material layer 630.

The liquid solvent can include any one or more liquids suitable for dispersing the polymer particles and for enabling drying (e.g., solvent evaporation) and curing (e.g., by further polymerization or cross-linking) of the polymer dispersion layer to form the cured polymer layer 620. In some examples, the liquid solvent of the polymer dispersion layer can include water; in some examples the resulting aqueous polymer dispersion can be a natural or synthetic latex. In some examples the liquid solvent can include one or more nonaqueous solvents (polar or nonpolar); in some of those examples the liquid solvent can also exclude water. In some examples, the polymer dispersion layer and the cured polymer layer 620 can include polyisoprene (i.e., polymerized 2-methyl-1,3-butadiene, also known as cis-1,4-polyisoprene). Other suitable polymers can be employed.

In some examples, the polymer dispersion layer can include one or more cross-linking agents. In some examples, the polymer dispersion layer can include one or more heat-resistant compounds. In some examples, the cured polymer layer 620 can withstand a temperature greater than about 100° C., greater than about 150° C., greater than about 200° C., or greater than about 250° C. In some examples, the polymer dispersion layer can include one or more chemical-resistant compounds. In some examples the cured polymer layer can be chemically resistant to one or more cleaning chemicals, one or more ALD reagents, one or more CVD reagents, or one or more dry or wet etchants). In some examples, the cured polymer layer 620 can be greater than about 1.0 µm, about 2.0 µm thick, or about 5 µm thick; in some examples, the cured polymer layer 620 can be less than about 0.20 mm thick, less than about 0.15 mm thick, or less than about 0.10 mm thick.

In some examples, the cured polymer layer 620 can be removed by peeling off of the one or more masked areas 600M (e.g., by grasping and pulling with tweezers or other gripping hardware or implement). In some examples, removal of the cured polymer layer 620 can include treatment by one or more solvents (e.g., one or more organic solvents).

This disclosure is illustrative and not limiting. Further modifications will be apparent to one skilled in the art in light of this disclosure and are intended to fall within the scope of the appended claims.

In addition to the preceding, the following example embodiments fall within the scope of the present disclosure or appended claims:

Example 1

A method comprising forming, on a substrate or on one or more semiconductor light-emitting devices mounted on or formed on the substrate, a polymer dispersion layer that comprises polymer particles dispersed in a liquid solvent.

Example 2

The method of Example 1 further comprising, after forming the polymer dispersion layer, drying and curing the polymer dispersion layer to form a cured polymer layer.

Example 3

The method of Example 2 further comprising, after curing and drying, with the cured polymer layer being present on only one or more selected, masked areas of the substrate or of the one or more light-emitting devices, and with one or more other areas of the substrate or of the one or more light-emitting devices lacking the cured polymer layer and remaining exposed, forming a material layer on at least the one or more exposed areas of the substrate or of the one or more light-emitting devices.

Example 4

The method of Example 3 further comprising, after forming the material layer, removing the cured polymer layer from the one or more masked areas, leaving the material layer on only the one or more exposed areas.

Example 5

The method of any one of Examples 2 through 4, the polymer dispersion layer being formed on only the masked areas before being dried and cured.

Example 6

The method of Example 5, the polymer dispersion layer being formed on only the masked areas by spatially selective dispensing, ink-jet printing, screen printing, slot-die coating, or doctor-blade coating.

Example 7

The method of any one of Examples 2 through 4, the polymer dispersion layer being formed on both masked and exposed areas before being dried and cured, the method further comprising removing portions of the cured layer, after the polymer dispersion layer is dried and cured, to form the exposed areas while leaving other portions of the cured polymer layer on the masked areas.

Example 8

The method of Example 7, the polymer dispersion layer being formed by dispensing, spin coating, slot-die coating, or doctor-blade coating.

Example 9

The method of any one of Examples 3 through 8, the material layer being formed on only the exposed areas.

Example 10

The method of any one of Examples 4 through 8, the material layer being formed on both the masked and exposed areas, and removal of the cured polymer layer from the masked areas also removes corresponding portions of the material layer from the masked areas while leaving other corresponding portions of the material layer on the exposed areas.

Example 11

The method of any one of Examples 1 through 10, the liquid solvent including water.

Example 12

The method of any one of Examples 1 through 11, the liquid solvent including one or more nonaqueous solvents.

Example 13

The method of any one of Examples 1 through 10, the liquid solvent including one or more nonaqueous solvents and excluding water.

Example 14

The method of any one of Examples 1 through 13, the polymer dispersion layer including a natural or synthetic latex.

Example 15

The method of any one of Examples 1 through 14, the polymer dispersion layer or the cured polymer layer including cis-1,4-polyisoprene.

Example 16

The method of any one of Examples 1 through 15, the polymer dispersion layer including one or more cross-linking agents.

Example 17

The method of any one of Examples 4 through 16, the cured polymer layer being removed by peeling off of the one or more masked areas.

Example 18

The method of any one of Examples 4 through 17, removal of the cured polymer layer including treatment by one or more solvents.

Example 19

The method of any one of Examples 2 through 18, the cured polymer layer being (i) greater than about 1.0 μm thick, about 2.0 μm thick, or about 5 μm thick, or (ii) less than about 0.20 mm thick, less than about 0.15 mm thick, or less than about 0.10 mm thick.

Example 20

The method of any one of Examples 1 through 19, the polymer dispersion layer including one or more heat-resistant compounds.

Example 21

The method of any one of any one of Examples 2 through 20, the cured polymer layer being able to withstand a temperature greater than about 100° C., greater than about 150° C., greater than about 200° C., or greater than about 250° C.

Example 22

The method of any one of Examples 1 through 21, the polymer dispersion layer including one or more chemical-resistant compounds.

Example 23

The method of any one of Examples 2 through 22, the cured polymer layer being chemically resistant to one or more cleaning chemicals, one or more atomic layer deposition (ALD) reagents, one or more chemical vapor deposition (CVD) reagents, or one or more dry or wet etchants.

Example 24

The method of any one of Examples 1 through 23, the one or more semiconductor light-emitting devices including one or more III-V semiconductor materials, including one or more binary, ternary, or quaternary alloys of gallium, aluminum, indium, nitrogen, phosphorus, or arsenic.

Example 25

The method of any one of Examples 3 through 24, forming the material layer including at least one substantially conformal deposition process.

Example 26

The method of any one of Examples 3 through 25, forming the material layer including at least one atomic layer deposition (ALD) process or at least one chemical vapor deposition (CVD) process.

Example 27

The method of any one of Examples 3 through 26, the material layer including one or more metal oxides or semiconductor oxides.

Example 28

The method of Example 27, precursors of the one or more metal or semiconductor oxides of the material layer including one or more metal or semiconductor halides, amides, alkyl amides, or alkoxides, or organometallic compounds.

Example 29

The method of any one of Examples 27 or 28: (i) the material layer including one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, and (ii) each light-emitting device including one or more of GaN, AlN, AlGaN, GaP, AlGaP, or AlInGaP.

Example 30

The method of any one of Examples 27 through 29, the material layer including $Al_2O_3$.

Example 31

The method of Example 30, the material layer precursors including one or more of trimethylaluminum ($Al(CH_3)_3$) or dimethylaluminum hydride ($HAl(CH_3)_2$).

Example 32

The method of any one of Examples 27 through 31, the coating layer being formed at temperatures less than about 150° C.

Example 33

The method of any one of Examples 3 through 32, the material layer including a multitude of optically scattering or luminescent particles and a coating layer of transparent material that (i) at least partly coats the particles of the multitude, (ii) adheres the particles of the multitude together, and (iii) adheres the multitude to the one or more light-emitting devices.

Example 34

The method of Example 33, the particles of the multitude being characterized by a D50 greater than about 0.10 μm and less than about 20 μm, and the coating layer of transparent material having a non-zero thickness less than about 0.3 μm thick.

Example 35

The apparatus of any one of Examples 33 or 34, the particles of the multitude including luminescent particles and the material layer forming one or more phosphor wavelength conversion layers of the one or more light-emitting devices.

Example 36

The apparatus of any one of Examples 33 through 35, material of the coating layer material having an index of refraction matching or approximately matching an index of refraction of light output surfaces of the one or more light-emitting devices.

Example 37

The method of any one of Examples 3 through 36, further comprising adhering to each of the one or more light-emitting devices, using a corresponding portion of the material layer, a corresponding phosphor wavelength conversion layer positioned on and in contact with the corresponding portion of the material layer.

Example 38

The method of any one of Examples 1 through 37, the one or more semiconductor light-emitting devices including one or more light-emitting diodes or one or more laser diodes.

Example 39

The method of any one of Examples 1 through 38, the one or more semiconductor light-emitting devices comprising an array of semiconductor light-emitting diodes, each light-emitting diode (i) having non-zero transverse dimensions less than about 1.0 millimeters (non-zero being sufficiently large to act as a light-emitting diode) or (ii) being separated from adjacent light-emitting diodes of the array by non-zero separation less than about 0.10 millimeters (non-zero being sufficiently large to enable independent operation of adjacent light-emitting diodes).

Example 40

The method of any one of Examples 1 through 38, the one or more semiconductor light-emitting devices comprising an array of semiconductor light-emitting diodes, each light-emitting diode (i) having non-zero transverse dimensions less than about 0.10 millimeters or less than about 0.05 millimeters, or (ii) being separated from adjacent light-emitting diodes of the array by non-zero separation less than about 0.05 millimeters, less than about 0.20 millimeters, or less than about 0.10 millimeters.

Example 41

The apparatus of any one of Examples 39 or 40, each light-emitting diode having a combined non-zero thickness of n-doped, active, and p-doped layers less than about 5 μm thick (non-zero being sufficiently thick to act as a light-emitting diode).

Example 42

The apparatus of any one of Examples 1 through 41, each light-emitting device including on a light-output surface thereof a protection layer, precursors of the protection layer having reactivity with respect to the light-output surface that is less than reactivity of material layer precursors.

Example 43

The method of Example 42, the protection layer including one or more metal or semiconductor oxides.

Example 44

The method of Example 43, precursors of the one or more metal or semiconductor oxides of the protection layer including one or more metal or semiconductor halides, amides, alkyl amides, or alkoxides, or organometallic compounds.

Example 45

The apparatus of any one or Examples 42 through 44: (i) material of the protection layer including one or more materials selected from a group consisting of $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, (ii) the material layer including one or more materials selected from a group consisting of $Al_2O_3$, $HfO_2$, $SiO_2$, $Ga_2O_3$, $GeO_2$, $SnO_2$, $CrO_2$, $Nb_2O_5$, $TiO_2$, $Ta_2O_5$, $V_2O_5$, $Y_2O_3$, and $ZrO_2$, and (iii) each light-emitting device including one or more of GaN, AlN, AlGaN, GaP, AlGaP, or AlInGaP.

Example 46

The apparatus of any one of Examples 42 through 45, the protection layer including $HfO_2$ and the material layer including $Al_2O_3$.

Example 47

The method of Example 46: (i) the protection layer precursors including one or more of tetrakis(dimethylamino)hafnium ($Hf(NMe_2)_4$), tetrakis(ethylmethylamino)hafnium ($Hf(NMeEt)_4$), or tetrakis(diethylamino)hafnium ($Hf(NEt_2)_4$), and (ii) the material layer precursors including one or more of trimethylaluminum ($Al(CH_3)_3$) or dimethylaluminum hydride ($HAl(CH_3)_2$).

Example 48

The method of any one of Examples 42 through 47, the protection layer and the coating layer each being formed at temperatures less than about 150° C.

Example 49

An apparatus made by the method of any one of Example 1 or Examples 5 through 48, the apparatus comprising: (i) a substrate; (ii) one or more semiconductor light emitting devices mounted on or formed on the substrate; and (iii) a polymer dispersion layer formed on at least portions of the substrate or the one or more light-emitting devices.

Example 50

The apparatus of Example 49, the polymer dispersion layer being present on only selected, masked areas of the substrate or the one or more light-emitting devices.

Example 51

An apparatus made by the method of any one of Example 2 or Examples 5 through 48, the apparatus comprising: (i) a substrate; (ii) one or more semiconductor light emitting devices mounted on or formed on the substrate; and (iii) a cured polymer layer formed on at least portions of the substrate or the one or more light-emitting devices.

Example 52

The apparatus of Example 51, the cured polymer layer (i) being present on only selected, masked areas of the substrate or the one or more light-emitting devices, and (ii) leaving other areas of the substrate or the one or more light emitting devices exposed.

Example 53

The apparatus of Example 52 further comprising a material layer formed on only the exposed areas of the substrate and the one or more light-emitting devices.

Example 54

The apparatus of Example 52 further comprising a material layer formed on the masked and exposed areas of the substrate and the one or more light-emitting devices, with the cured polymer layer between the material layer and the masked areas of the substrate or the one or more light emitting devices.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth. For null quantities described by phrases such as "prevented," "absent," "eliminated," "equal to zero," "negligible," and so forth (with or without terms such as "substantially" or "about"), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A method comprising:
    (a) forming a polymer dispersion layer on a substrate having one or more semiconductor light-emitting devices mounted or formed thereon, the polymer dispersion layer comprising polymer particles dispersed in a liquid solvent and being present on at least portions of the substrate or the one or more semiconductor light-emitting devices thereon;
    (b) after forming the polymer dispersion layer, drying and curing the polymer dispersion layer to form a cured polymer layer;
    (c) after curing and drying, with the cured polymer layer being present on only one or more selected, masked areas of the substrate or of the one or more light-emitting devices thereon, and with one or more other, exposed areas of the substrate or of the one or more light-emitting devices thereon lacking the cured polymer layer and remaining exposed, forming a material layer on at least the one or more exposed areas of the substrate or of the one or more light-emitting devices thereon; and
    (d) after forming the material layer, removing the cured polymer layer from the one or more masked areas, leaving the material layer on only the one or more exposed areas.

2. The method of claim 1 wherein the polymer dispersion layer is formed on only the masked areas, by spatially selective dispensing, ink-jet printing, screen printing, slot-die coating, or doctor-blade coating, before being dried and cured.

3. The method of claim 1 wherein the polymer dispersion layer is formed, by dispensing, spin coating, slot-die coating, or doctor-blade coating, on both masked and exposed areas before being dried and cured, and the method further comprises removing portions of the cured polymer layer, after the polymer dispersion layer is dried and cured, to form the exposed areas while leaving other portions of the cured polymer layer on the masked areas.

4. The method of claim 1 wherein the material layer is formed on only the exposed areas.

5. The method of claim 1 wherein the material layer is formed on both the masked and exposed areas, and removal of the cured polymer layer from the masked areas also removes corresponding portions of the material layer from the masked areas while leaving other corresponding portions of the material layer on the exposed areas.

6. The method of claim 1 wherein the liquid solvent includes water.

7. The method of claim 1 wherein the liquid solvent includes one or more nonaqueous solvents and excludes water.

8. The method of claim 1 wherein (i) the polymer dispersion layer includes a natural or synthetic latex, or (ii) the polymer dispersion layer or the cured polymer layer includes cis-1,4-polyisoprene.

9. The method of claim 1 wherein the cured polymer layer is removed by peeling off of the one or more masked areas.

10. The method of claim 1 wherein removal of the cured polymer layer includes treatment by one or more solvents.

11. The method of claim 1 wherein the cured polymer layer is greater than about 1.0 µm thick or less than about 0.20 mm thick.

12. The method of claim 1 wherein the cured polymer layer includes one or more heat-resistant compounds that are able to withstand a temperature greater than about 100° C.

13. The method of claim 1 wherein the cured polymer layer includes one or more chemical-resistant compounds that are chemically resistant to one or more atomic layer deposition (ALD) reagents, one or more chemical vapor deposition (CVD) reagents, or one or more dry or wet etchants.

14. The method of claim 1, wherein: (i) the material layer includes one or more metal oxides or semiconductor oxides; (ii) forming the material layer includes at least one atomic layer deposition (ALD) process or at least one chemical vapor deposition (CVD) process; and (iii) precursors of the one or more metal or semiconductor oxides of the material layer include one or more metal or semiconductor halides, amides, alkyl amides, or alkoxides, or organometallic compounds.

15. The method of claim 14 wherein: (i) the material layer includes $Al_2O_3$, (ii) the material layer precursors include one or more of trimethylaluminum ($Al(CH_3)_3$) or dimethylaluminum hydride ($HAl(CH_3)_2$), and (iii) the material layer is formed at temperatures less than about 150° C.

16. The method of claim 1 wherein the material layer includes a plurality of optically scattering or luminescent particles and a coating layer of transparent material that (i) at least partly coats the particles of the plurality, (ii) adheres the particles of the plurality together, and (iii) adheres the plurality to the one or more light-emitting devices.

17. The method of any claim 16 wherein material of the coating layer material has an index of refraction matching or approximately matching an index of refraction of light output surfaces of the one or more light-emitting devices.

18. The method of claim 16 wherein: (i) the coating layer includes $Al_2O_3$, deposited by an ALD process using one or more coating layer precursors, (ii) the coating layer precursors include one or more of trimethylaluminum ($Al(CH_3)_3$) or dimethylaluminum hydride ($HAl(CH_3)_2$), and (iii) the coating layer is formed at temperatures less than about 150° C.

19. The method of claim 1, wherein the one or more semiconductor light-emitting devices include one or more III-V semiconductor materials, including one or more binary, ternary, or quaternary alloys of gallium, aluminum, indium, nitrogen, phosphorus, or arsenic.

20. The method of claim 1, the one or more semiconductor light-emitting devices comprising an array of semiconductor light-emitting diodes, each light-emitting diode (i) having non-zero transverse dimensions less than about 1.0 millimeters, (ii) being separated from adjacent light-emitting diodes of the array by non-zero separation less than about 0.10 millimeters, or (iii) having a combined non-zero thickness of n-doped, active, and p-doped layers less than about 5 µm thick.

* * * * *